Oct. 12, 1965 H. J. KLEE 3,211,927

CIRCUIT OVERLOAD PROTECTOR

Filed Oct. 2, 1962

INVENTOR.
HARVEY J. KLEE

BY

ATTORNEYS

United States Patent Office 3,211,927

Patented Oct. 12, 1965

3,211,927
CIRCUIT OVERLOAD PROTECTOR

Harvey J. Klee, San Diego, Calif., assignor to the United States of America as represented by the Secretary of the Navy Filed Oct. 2, 1962, Ser. No. 227,964
12 Claims. (Cl. 307—88.5)
(Granted under Title 35, U.S. Code (1952), sec. 266)

The invention described herein may be manufactured and used by or for the Government of the United States of America for governmental purposes without the payment of any royalties thereon or therefor.

The present invention relates generally to protective systems for devices using electrical current and in particular is a dynamic microsecond overload protector for protecting transistorized, semi-conductor, and other electronic circuits against dynamic overloads or short circuits by removing the input intelligence signal supplies thereto within a minimum and safe time period.

In the past, such prior art devices as quick-blow fuses and magnetic overload relays were employed as overload protection devices. Although satisfactory for protection of many types of devices and for many operations, the aforesaid prior art devices are not ordinarily satisfactory protectors for circuits containing transistors, semi-conductors, or other solid state physics electronic elements, because they do not function fast enough to be practically effective and because they adversely load the element or elements being used in any given circuit.

The present invention overcomes these difficulties in that it functions rapidly enough to actually protect semiconductor and other electronic circuits and does so without adversely loading the circuit involved. In addition, it, itself, consists of a circuit that may be manufactured by use of printing circuit techniques which, in turn, facilitates production and packaging thereof and requires only a minimum of physical installation space.

It is therefore an object of this invention to provide an improved overload protector for electronic circuit devices.

Another object of this invention is to provide a dynamic microsecond overload and short circuit protector which functions rapidly enough to protect electronic circuits containing transistors, semi-conductors, super-conductors and other solid state physics devices.

Still another object of this invention is to provide a method and means for preventing the overload of electronic circuits without adversely affecting or loading the circuit involved.

A further objective of this invention is to provide a dynamic microsecond overload protector which may be readily manufactured by use of printed circuit technique.

Still another object of this invention is to provide an improved overload circuit protection device which requires only a minimum of physical space.

Another object of this invention is to provide an improved method and means for protecting transistorized electronic circuits without the protector, itself, taking part in or influencing the operation of the circuit involved.

Another object of this invention is to provide a dynamic microsecond overload protector which may be easily and economically manufactured and maintained.

Other objects and many of the attendant advantages of this invention will be readily appreciated as the same becomes better understood by reference to the following detailed description when considered in conjunction with the accompanying drawings in which like reference numerals designate like parts throughout the figures thereof and wherein.

Figure 1:
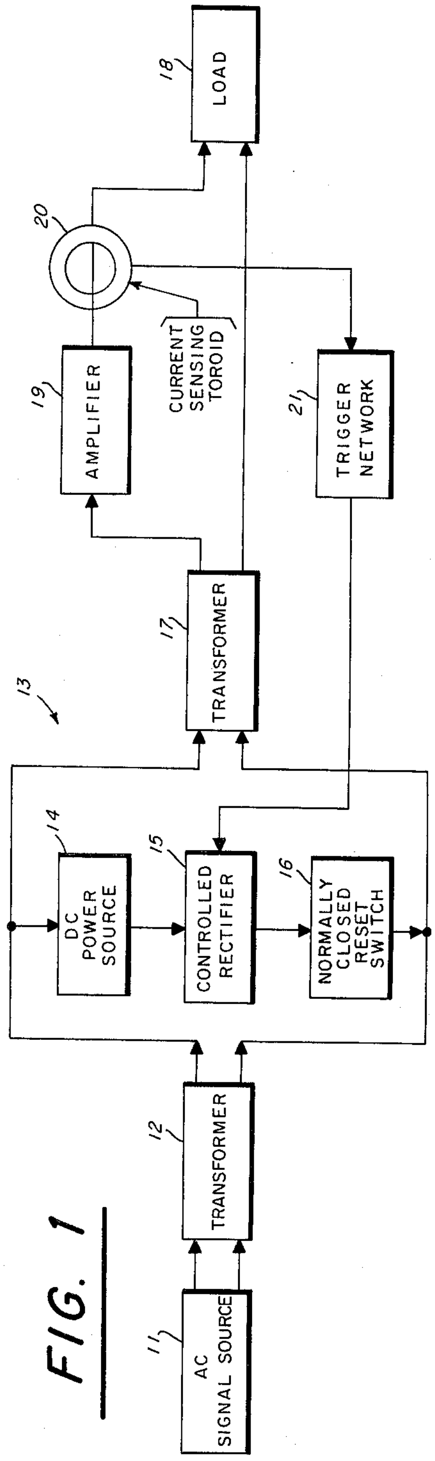
FIG. 1 is a block diagram of the invention combined with the load it is intended to protect and the signal source intended to provide the intelligence signal to said load.

Referring now to FIG. 1, there is shown an A.C. signal source 11 having its output connected to a transformer 12. Typical examples of the devices that may be employed as A.C. signal source 11 are tone generators, frequency modulation signal generators, and pseudorandom noise generators; however, it should be understood that the subject invention is not intended to be limited thererto. The outputs of transformer 12 have connected thereacross a shunting element 13 consisting of a series connected direct current power source 14, a GE–C104 controlled rectifier 15 or the like, and a normally closed reset switch 16. In addition to being connected to the aforesaid shunting element 13, the outputs of transformer 12 are coupled to the inputs of another transformer 17. One of the outputs of transformer 17 is directly coupled to one of the inputs of a load 18 while the other output of transformer 17 is connected through an amplifier 19 and then through the center aperture of a current sensing torodial wound transformer 20 to the other input of load 18. Load 18, of course, may be any appropriate electrical load but is primarily intended to be an electronic circuit. Typical examples of such loads are amplifiers and preamplifiers of transmitters, transducers, motors, and the like. Again, it should be understood that the foregoing are examples only and that many other electrical loads are susecptible for being protected by the subject invention. Connected between the output of current sensing toroid transformer 20 and the input of the aforesaid controlled rectifier 15 is a trigger network 21.

Figure 2:
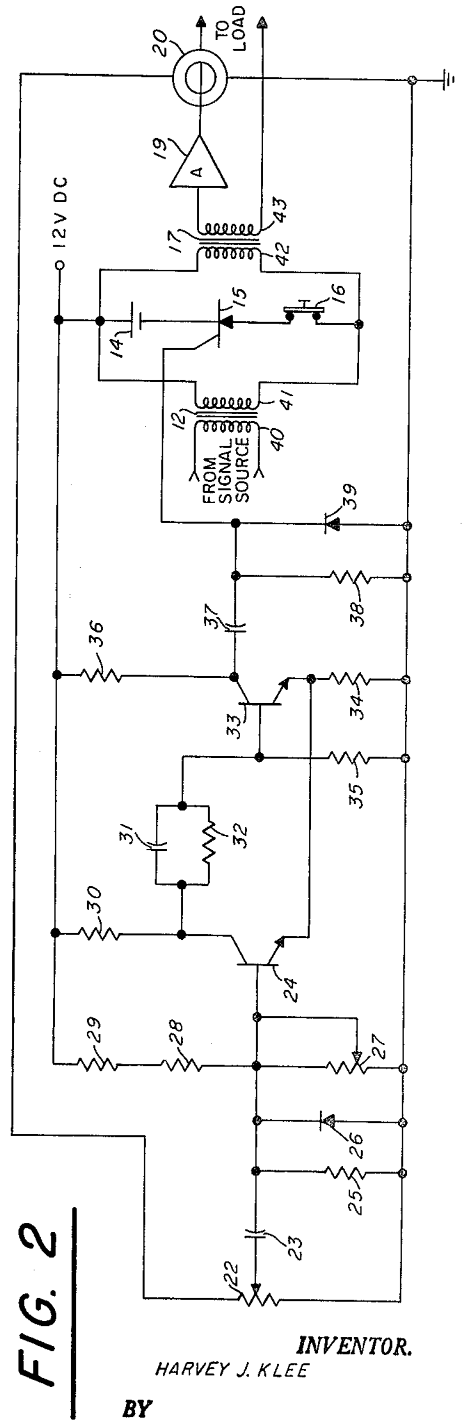
FIG. 2 is a detailed schematic diagram of the invention shown in block diagram form in FIG. 1.

Referring now to the detail schematic diagram of the subject invention depicted in FIG. 2, there is shown a potentiometer 22 with one of the terminals thereof connected to the output of current sensing toroid 20 and the other terminal thereof connected to ground. The slide of potentiometer 22 is connected through the coupling capacitor 23 to the base of an npn transistor 24 which may, for example, be of the 2N167 type. The output of said capacitor 23 is likewise connected through parallel connected resistor 25, diode 26, and the resistance portion of potentiometer 27, to ground. The base of transistor 24 is also connected through series connected resistors 28 and 29 to a B+ voltage of 12 volts D.C. The collector of transistor 24 is likewise connected to B+ voltage through a resistor 30 and is also connected through a parallel connected capacitor 31 and resistor 32 to the base of another npn transistor 33 which also may be of the 2N167 type. The emitter of transistor 24 is connected directly to the emitter of transistor 33 and both are connected to ground through a resistor 34. A resistor 35 likewise interconnects the base of transistor 33 and ground. The collector of transistor 33 is connected through a resistor 36 to the aforesaid B+ voltage and through a coupling capacitor 37 to the control element of control rectifier 15. The output of capacitor 37 is also coupled through parallel connected resistor 38 and diode 39 to ground. Battery 14 has its negative pole connected to said controlled rectifier 15 and its positive pole connected to the aforesaid B+ voltage. One terminal of diode 15 is connected to a normally closed reset switch 16.

The aforesaid transformer 12 has a primary winding 40 and a secondary winding 41, with the primary winding thereof adapted to receive electrical power from any given signal source such as is exemplarily illustrated as A.C. signal source 11 in FIG. 1. Likewise, transformer 17 has a primary winding 42 and a secondary 43. The terminals of secondary winding 41 of transformer 12 are connected to the appropriate terminals of primary winding 42 of transformer 17, and of course, as can be seen, the aforesaid battery 14, control rectifier 15, and normally closed reset switch 16 comprising the aforesaid shunting element 13 are connected across the interconnected secondary and primary windings 41 and 42 of transformers 12 and 17. One of the terminals of the secondary winding 43 of transformer 17 is adapted to be connected to any appropriate electrical load such as is represented by load 18 in FIG. 1, and the other terminal thereof is connected to amplifier 19, the output of which extends through the center hole of toroid 20 to ultimately connect to said load. To complete the circuit of the current sensing toroid transformer 20, one of the electrical leads thereof is coupled to ground and the other lead thereof is connected to the aforesaid potentiometer 22 in the manner previously mentioned.

It should be understood that all of the foregoing elements, whether disclosed in block diagram form in FIG. 1 or disclosed in detailed schematic form in FIG. 2, are conventional and well known in the art per se and, therefore, that it is their interconnection and interaction that it is unique and produces a new and improved results ascribed to this invention.

Briefly, the operation of the subject invention is as follows:

In order to sense the load current without adding an additional adverse electrical loading factor thereto, the toroidal wound transformer is contiguously disposed with one of the electrical leads connected to said load to effect electromagnetic coupling therewith. An output voltage proportional to the operational load input signal current is developed by said torodial transformer and this voltage is then fed to the Schmitt trigger circuit, which, in turn, triggers a controlled silicon rectifier that shorts out the input voltage drive whenever said voltage or operating input signal current exceeds a predetermined value.

Specifically, to effect this operation, the input signal current to the load flows through toroidal transformer 20 and the output voltage proportional to said input signal current that is developed thereby is applied across the resistance portion of potentiometer 22. The preset level of voltage which is directly proportional to the current determined to be maximum for safe operation of the load is picked off of potentiometer 22 by the adjustable slide arm thereof. After this voltage is picked off of potentiometer 22, it is then coupled through the direct current restoring network consisting of capacitor 23, resistor 25, and diode 26 to the base of the first transistor of the Schmitt trigger circuit. The Schmitt trigger circuit, of course, is an amplitude sensitive device that will trigger at a desired voltage amplitude which, in this case, is determined by the safe allowable current to be applied to the load. In this Schmitt trigger circuit, resistor 25 should preferably be chosen to give proper input impedance thereto and should be considered in conjunction with resistor 38, the load resistor, to effect the proper trigger output voltage. Resistors 30, 32, and 35 determine the bias of conducting transistor 33. This bias causes the emitter current from transistor 24 to flow in resistor 34 which thus develops a voltage that must be overcome by the input signal in order to cause transistor 24 to conduct. When transistor 24 conducts it, in turn, cuts off transistor 33, causing an output pulse to occur from the Schmitt trigger circuit.

Resistors 28 and 29 along with the resistance of potentiometer 27 actually determine the trigger level of the subject device, and resistor 32 in parallel combination with capacitor 31 form a cross coupling network that insures a sharp leading edge to the waveform which triggers transistor 33 to the off state, thereby insuring exceedingly rapid action.

The output of the Schmitt trigger circuit is then coupled through the RC network consisting of capacitor 37 and resistor 38 and another direct current restoring circuit consisting of diode 39 to the gate of the silicon controlled rectifier 15 which, of course, is biased in the forward direction by the B+ supply of 12 volts. The application of said positive signal to the gate of controlled rectifier 15 causes it to conduct and, hence, acts as a short circuit across the secondary winding 41 of transformer 12 and primary winding 42 of transformer 17, thereby electrically isolating the input signal from A.C. signal source 11 from the load 18. At this time, the direct current flowing in each of said transformer windings is limited by the D.C. resistance thereof. Accordingly, controlled rectifier 15 continues to conduct until reset switch 16 is momentarily opened, breaking the conducting path of controlled rectifier 15. This feature, of course, causes the load to be effectively shut off and held off until the cause of the overload or short circuit can be removed.

As a result of such operation, it can thus be readily seen that any given electrical load, including electrical loads containing transistors, semiconductors, superconductors, or any other solid physics devices, may be protected against damage or destruction due to current overloading or short circuiting as a result of the malfunctioning of a signal source, when the subject invention is combined therewith as taught herein.

It should be obvious to one skilled in the art that many modifications and variations of the present invention are possible in the light of the foregoing teachings. It is, therefore, to be understood that within the scope of the appended claims the subject invention may be practiced otherwise than as specifically described.

What is claimed is:

1. An overload protector for electronic circuits comprising in combination, a first transformer having a pair of inputs and a pair of outputs, a second transformer having a pair of inputs and a pair of outputs with the inputs thereof respectively connected to the outputs of said first transformer, means contiguously disposed with one of the outputs of said second transformer for sensing the current flow therein, and silicon controlled rectifier means connected to said current sensing means and across the interconnected inputs and outputs of said second and first transformers for shorting same when said sensed current flow exceeds a predetermined level.

2. The device of claim 1 wherein said means contiguously disposed with one of the outputs of said second transformer for sensing the current flow therein is a toroidal wound transformer.

3. An electronic circuit overload protector comprising in combination a first transformer having a primary winding adapted for being connected to a power supply and a secondary winding, a series connected battery, controlled rectifier, and reset switch connected across the secondary winding of said first transformer, a second transformer having a primary winding connected to the secondary winding of said first transformer and a secondary winding adapted for being coupled to a load, a toroidal coil effectively disposed around a portion of the secondary winding of said second transformer, and a Schmitt trigger network interconnecting said toroidal coil and the aforesaid controlled rectifier.

4. Means for preventing the current overload of circuits containing semiconductors comprising in combination, a first transformer having a primary winding and a secondary winding, a second transformer having a primary winding and a secondary winding, said secondary winding of said first transformer connected to the primary winding of said second transformer, a controllable silicon rectifier connected in parallel with said interconnected secondary and primary windings of said first and second transformers, means electromagnetically disposed with a portion of the secondary winding of said second transformer for sensing the current flow therein and generating a potential proportional thereto without taking part in, loading, or adversely effecting the operation of said secondary winding of said second transformer, and means for applying said potential to the aforesaid controlable silicon rectifier for effecting the conduction thereof when the current flowing in the secondary winding of said second transformer exceeds a predetermined value.

5. A rapid acting electronic circuit overload protector comprising in combination, a pair of series connected transformers adapted for being inserted in an electrical line between an A.C. signal source and an electrical load, switch means interconnecting the common connections of said series connected transformers for shorting the interconnected windings thereof upon application of a predetermined actuation potential to said switch means, and current sensing means electromagnetically associated with one of said series connected transformers for supplying said predetermined actuation potential to said switch means when the power output of said one transformer exceeds a given value.

6. The device of claim 5 wherein said switch means is a controllable silicon rectifier.

7. The device of claim 5 wherein said current sensing means is a toroidal wound transformer.

8. The device of claim 5 wherein said current sensing means is a transformer contiguously disposed with an output of one of said pair of series connected transformers.

9. The device of claim 5 further characterized by a battery connected to said switch means for biasing same in an open condition until said predetermined actuation potential is applied thereto.

10. The device of claim 5 further characterized by means interconnecting said switch means and said pair of series connected transformers for resetting said switch means to an open condition when the power output of said one transformer is less than the aforesaid given value.

11. The device of claim 5 further characterized by a Schmitt trigger circuit inserted between said current sensing means and the aforesaid switch means.

12. The device of claim 11 wherein said Schmitt trigger circuit comprises a first transistor amplifier stage and a second transistor amplifier stage cascaded therewith.

References Cited by the Examiner

UNITED STATES PATENTS

| | | | |
|---|---|---|---|
| 2,910,626 | 10/59 | Koros | 317—16 |
| 2,925,548 | 2/60 | Scherer et al. | 317—16 |
| 3,084,284 | 4/63 | Schultz | 328—9 |
| 3,099,775 | 7/63 | Mortlock et al. | 317—33 |

OTHER REFERENCES

Alternating-Current Circuits by Kerchner and Corcoran, pub. by John Wiley & Sons, Inc., New York. Printed November 1956, pp. 237 and 372 relied on.

G.E. Publication: "Phase-Controlling Kilowatts with Silicon Semiconductors," by F. W. Gutzwiller, 1st page relied on. Reprinted from May 1959 issue of Control Engineering.

"Overvoltage Protective Circuit," by Essinger, IBM Technical Disclosure Bulletin, vol. 2, No. 4, December 1959, page 96 relied on.

Silicon Controlled Rectifier Manual by General Electric. (Copyright Dec. 29, 1961, page 72 relied on.)

ARTHUR GAUSS, *Primary Examiner.*

JOHN W. HUCKERT, *Examiner.*